United States Patent
Xiao et al.

(10) Patent No.: US 8,049,511 B2
(45) Date of Patent: Nov. 1, 2011

(54) METHOD OF DETECTING FAULTY VIA HOLES IN PRINTED CIRCUIT BOARDS

(75) Inventors: Li Xiao, Shenzhen (CN); I-Hsien Chiang, Taoyuan (TW); Chih-Yi Tu, Taoyuan (TW)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 719 days.

(21) Appl. No.: 12/143,632

(22) Filed: Jun. 20, 2008

(65) Prior Publication Data

US 2009/0039895 A1 Feb. 12, 2009

(30) Foreign Application Priority Data

Aug. 10, 2007 (CN) .......................... 2007 1 0075668

(51) Int. Cl.
*G01R 31/08* (2006.01)

(52) U.S. Cl. ........................................................ 324/525
(58) Field of Classification Search .................. 324/525
See application file for complete search history.

(56) References Cited

U.S. PATENT DOCUMENTS

| 5,550,844 | A  | * | 8/1996 | Lucas ............................ 714/734 |
| 6,366,100 | B1 | * | 4/2002 | Ito et al. .................... 324/750.16 |
| 6,940,288 | B2 | * | 9/2005 | Barr et al. ...................... 324/525 |
| 7,514,941 | B2 | * | 4/2009 | Barton .......................... 324/719 |
| 2005/0112948 | A1 | * | 5/2005 | Lee ............................... 439/631 |

FOREIGN PATENT DOCUMENTS

JP 2006-200946 A 8/2006

\* cited by examiner

*Primary Examiner* — Amy He

(74) *Attorney, Agent, or Firm* — Altis Law Group, Inc.

(57) ABSTRACT

A method of detecting faulty via holes of a printed circuit board. The printed circuit board including a number of electric trace segments. The method includes steps of: providing a testing system, the testing system comprising a processor, a storing means and a resistance measuring device, the storing means for storing a function $Y_{min}=f_{min}(X)$ wherein X represents a reference resistance associated with a given electric trace segment, $Y_{min}$ represents a minimum threshold value; measuring a resistance of an electric trace segment of a to-be-tested printed circuit board using the resistance measuring device, a to-be-tested via hole located on the electric trace segment; and judging whether the to-be-tested via hole is a faulty via hole according to the following criteria: if $|Xa-X| \geq Y_{min}$, the to-be-tested via hole is a faulty via hole, and if $|Xa-X| < Y_{min}$, the to-be-tested via hole is an acceptable via hole, wherein Xa represents the measured resistance of the given electric trace segment counterpart of the to-be-tested printed circuit board.

6 Claims, 6 Drawing Sheets

METHOD OF DETECTING FAULTY VIA HOLES IN PRINTED CIRCUIT BOARDS

BACKGROUND

1. Technical Field

The present invention relates to a method of detecting faults in printed circuit boards, especially, to a method of detecting faults in holes of printed circuit boards.

2. Discussion of Related Art

Recently, as the electronic appliances are becoming smaller in size and diversified in function, printed circuit boards (PCBs) widely used in such electronic appliances are required to have high circuit density and reliability.

In order to ensure that printed circuit board can perform its intended function, PCBs must be tested after manufactured. There may be various faults in the printed circuit boards, for example, impurity, over-etching and disconnection. Faults in transmission lines can be easily observed in a telescope or by an automatic optical inspection (AOI) apparatus, however, faults in holes can not be directly observed, it is difficult to detect faults in various holes.

Therefore, there is a desire to develop a method suitable for detecting faults in various holes.

SUMMARY

In one embodiment, a method of detecting faulty via holes of a printed circuit board. The printed circuit board including a number of electric trace segments. The method includes steps of: providing a testing system, the testing system comprising a processor, a storing means and a resistance measuring device, the storing means for storing a function $Y_{min}=f_{min}(X)$ wherein X represents a reference resistance associated with a given electric trace segment, $Y_{min}$ represents a minimum threshold value; measuring a resistance of an electric trace segment of a to-be-tested printed circuit board using the resistance measuring device, a to-be-tested via hole located on the electric trace segment; and judging whether the to-be-tested via hole is a faulty via hole according to the following criteria: if $|Xa-X| \geq Y_{min}$, the to-be-tested via hole is a faulty via hole, and if $|Xa-X| < Y_{min}$, the to-be-tested via hole is an acceptable via hole, wherein Xa represents the measured resistance of the given electric trace segment counterpart of the to-be-tested printed circuit board.

This and other features and advantages of the present invention as well as the preferred embodiments thereof and a method of detecting faults in holes of printed circuit boards in accordance with the invention will become apparent from the following detailed description and the descriptions of the drawings.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment.

DETAILED DESCRIPTION OF THE PREFERRED EMBODIMENTS

Figure 1:
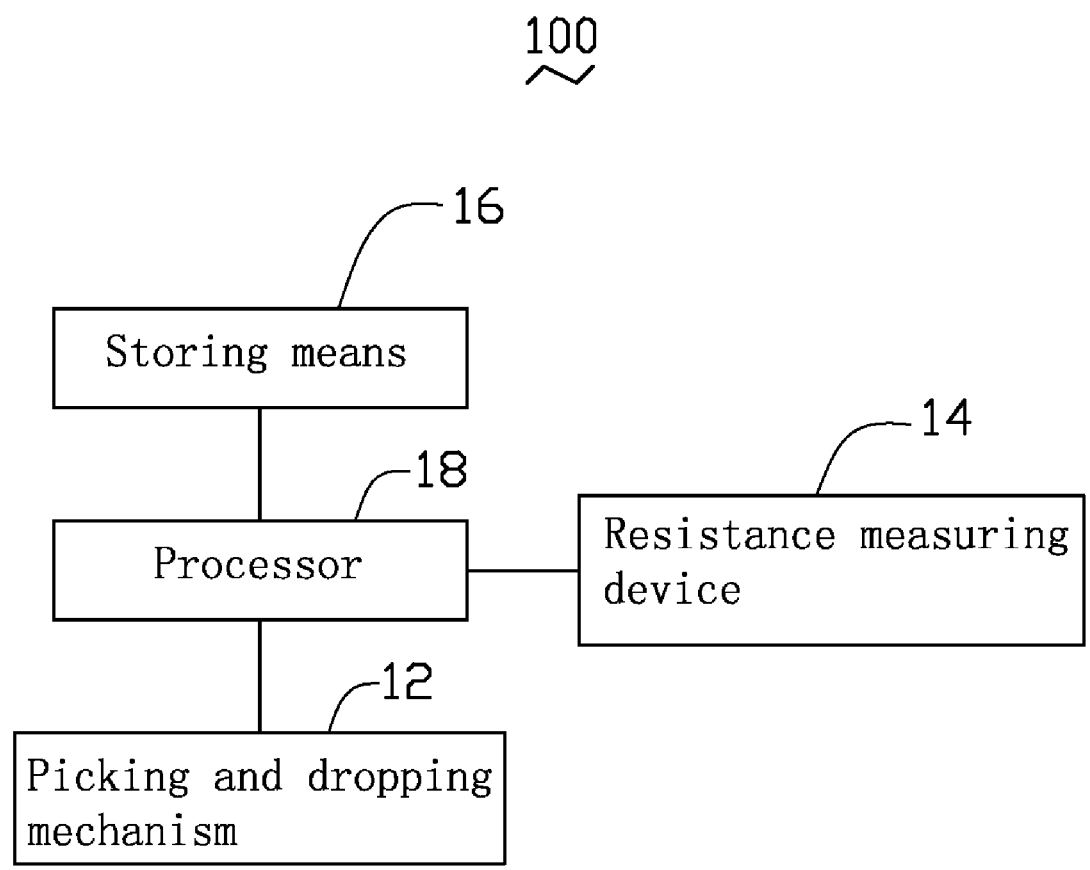
FIG. 1 illustrates a printed circuit board testing system.

FIG. 1 illustrates a testing system 100 configured for detecting faults in holes of printed circuit boards. The testing system 100 includes a picking and dropping mechanism 12, a resistance measuring device 14, a storage means 16 and a processor 18.

The picking and dropping mechanism 12 is an apparatus capable of sucking a printed circuit board, and usually includes a robot arm, a vacuum pad and a vacuum plate. The resistance measuring device 14 can be flying probe test system and in-circuit testing (ICT) system. The storing means 16 can be hard disk drive, soft disk drive, compact disk drive, flash memory, etc. The picking and dropping mechanism 12 and the resistance measuring device 14 are electrically coupled to the processor 18. The processor 18 is capable of sending instructions to the picking and dropping mechanism 12 and the resistance measuring device 14, thereby controlling the picking and dropping mechanism 12 and the resistance measuring device 14.

The storing means 16 has data stored therein. The data includes location information and standard resistance of electric trace segments in the printed circuit board, and criteria for determining whether the electric trace segment includes a certain type of fault based on a difference between the actual resistance and the standard resistance of electric trace segment.

The criteria includes parameter related to resistance difference between a standard resistance value and a measured value. For example, an electric trace segment has a standard resistance of X and a measured resistance Y, if a numerical value of (Y−X)/X exceeds 20%, then the electric trace segment has a certain type of fault, e.g., a fault of scrap remaining in through holes or via holes. The criteria may be varied with different types of faults. A method of getting such a criteria will be described in detail in following.

Figure 2:
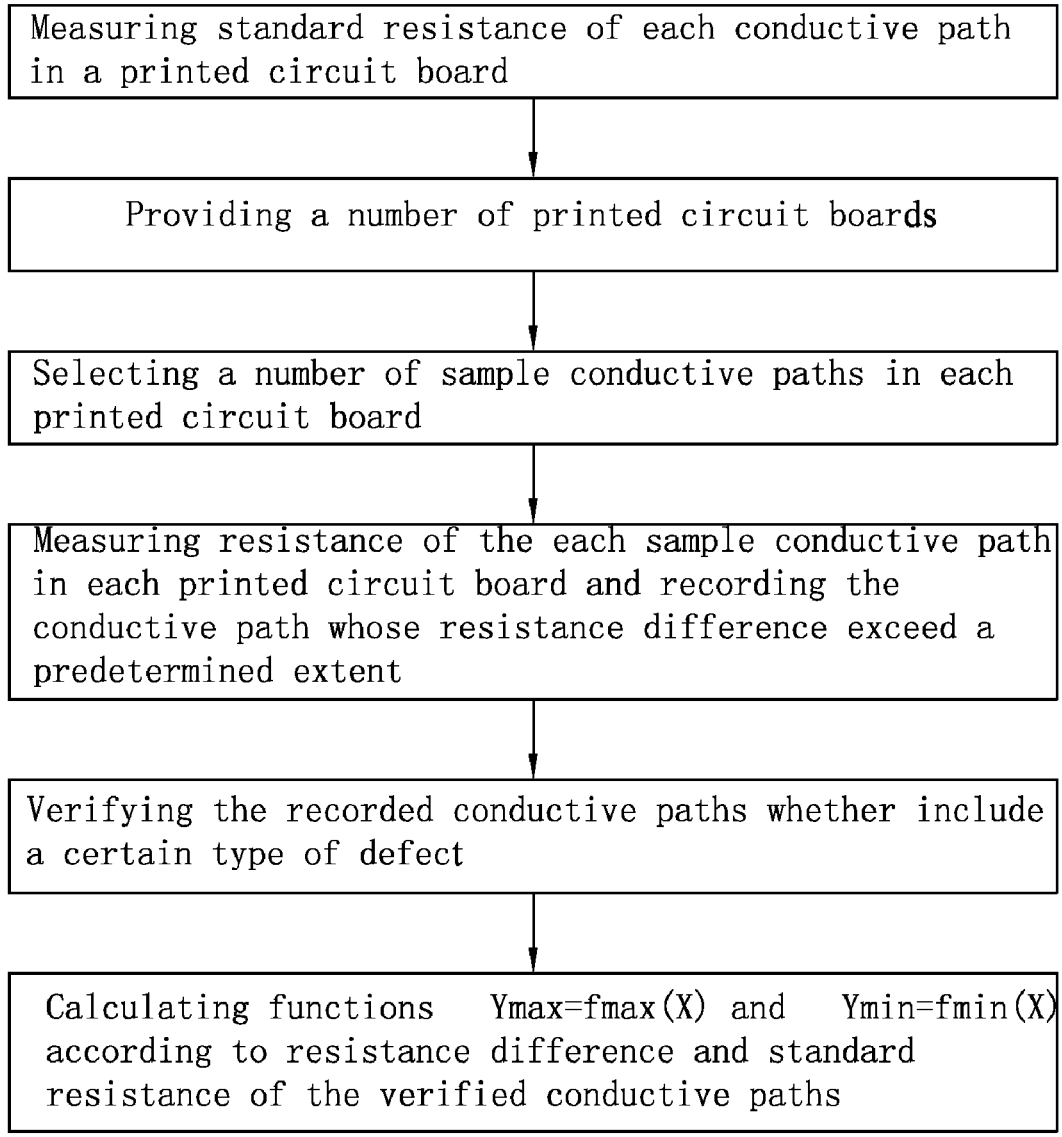
FIG. 2 illustrates a method of establishing a definition describing a resistance difference caused by a certain type of fault.
Figure 3:
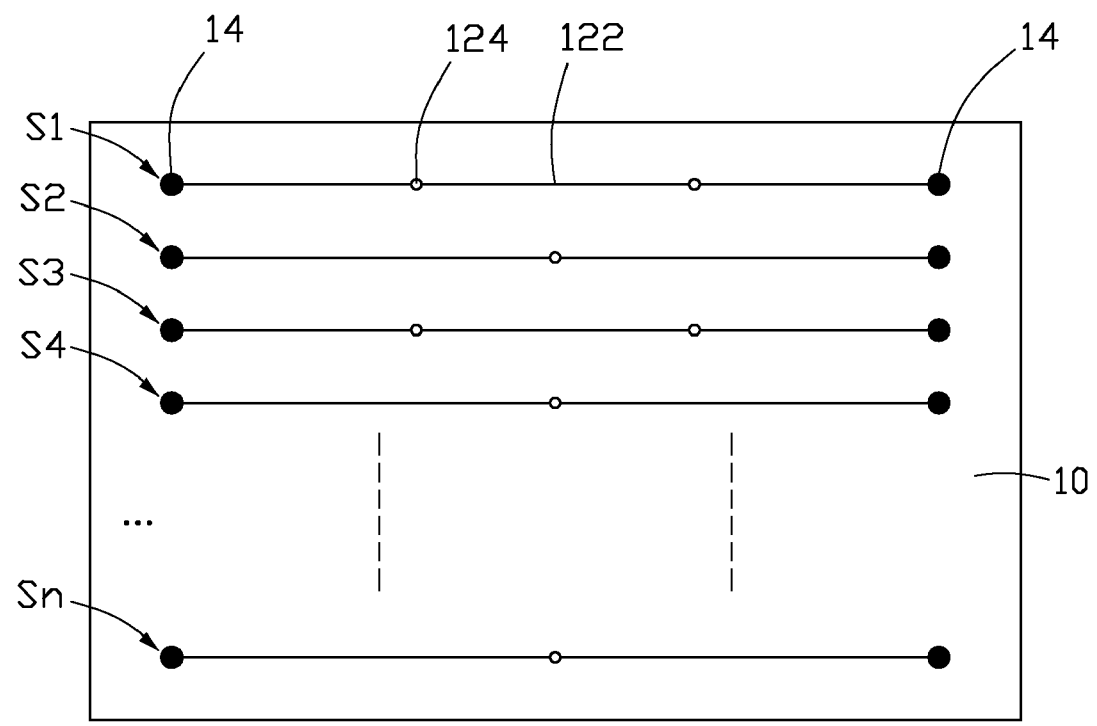
FIG. 3 illustrates a printed circuit board to be tested.

FIG. 2 illustrates a method of establishing a criteria describing a resistance difference caused by a certain type of fault, the method will be described in detail as following:

In step 1, standard resistances of a printed circuit board is measured. FIG. 3 illustrates a printed circuit board 100 having a number of electric trace segments S1, S2, S3, . . . Sn formed therein. Each electric trace segment includes a conductive transmission line 122 and one or more conductive holes 124 defined therein. Two testing points 14 are defined at two ends of the conductive transmission line 122 with the one or more conductive holes 124.

In order to measure standard resistance of each electric trace segment, a number of printed circuit boards 10, e.g., 50 to 100 pieces, are provided. There are no faults in conductive holes 124 of these printed circuit boards 10. Preferably, the printed circuit boards 10 are fabricated in a same production line. Resistance of each of the electric trace segment 122 of the printed circuit boards 10 is measured. An average resistance of the electric trace segments of the printed circuit board 10 is used as the standard resistance of the corresponding electric trace segment 122. Similarly, a number of standard resistances corresponding to a number of electric trace segments can be obtained. The standard resistances can be marked as X1, X2, . . . , Xn.

Figure 4:
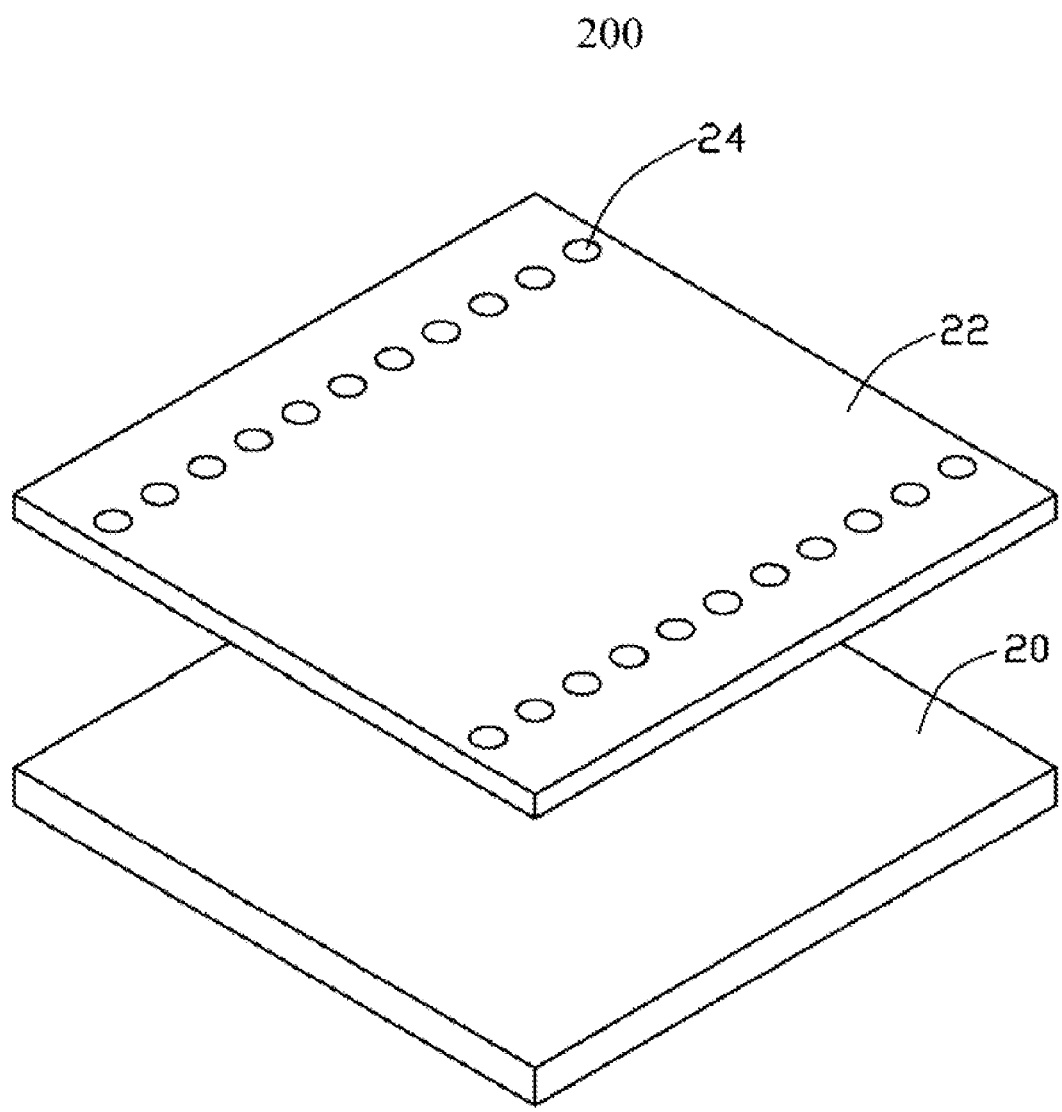
FIG. 4 illustrates a fixture used to hold the printed circuit board of FIG. 3.
Figure 5:
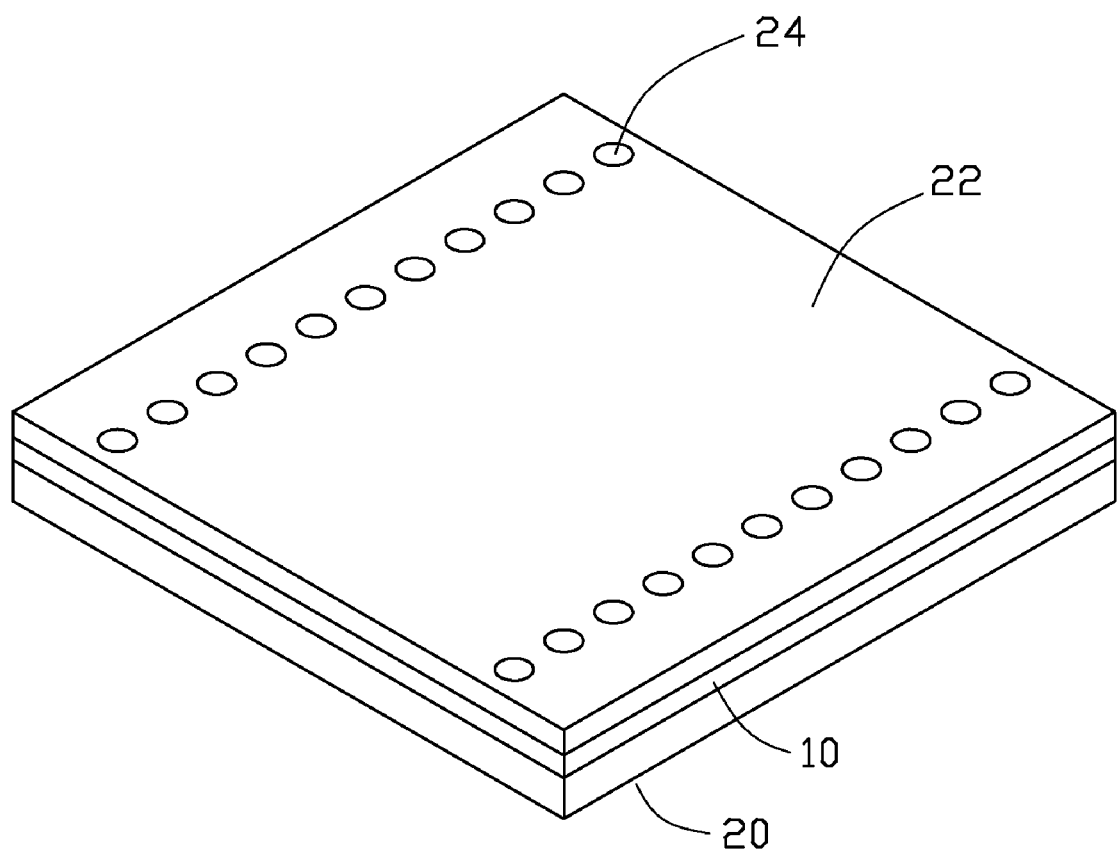
FIG. 5 illustrates that the printed circuit board is held on the fixture of FIG. 4.
Figure 6:
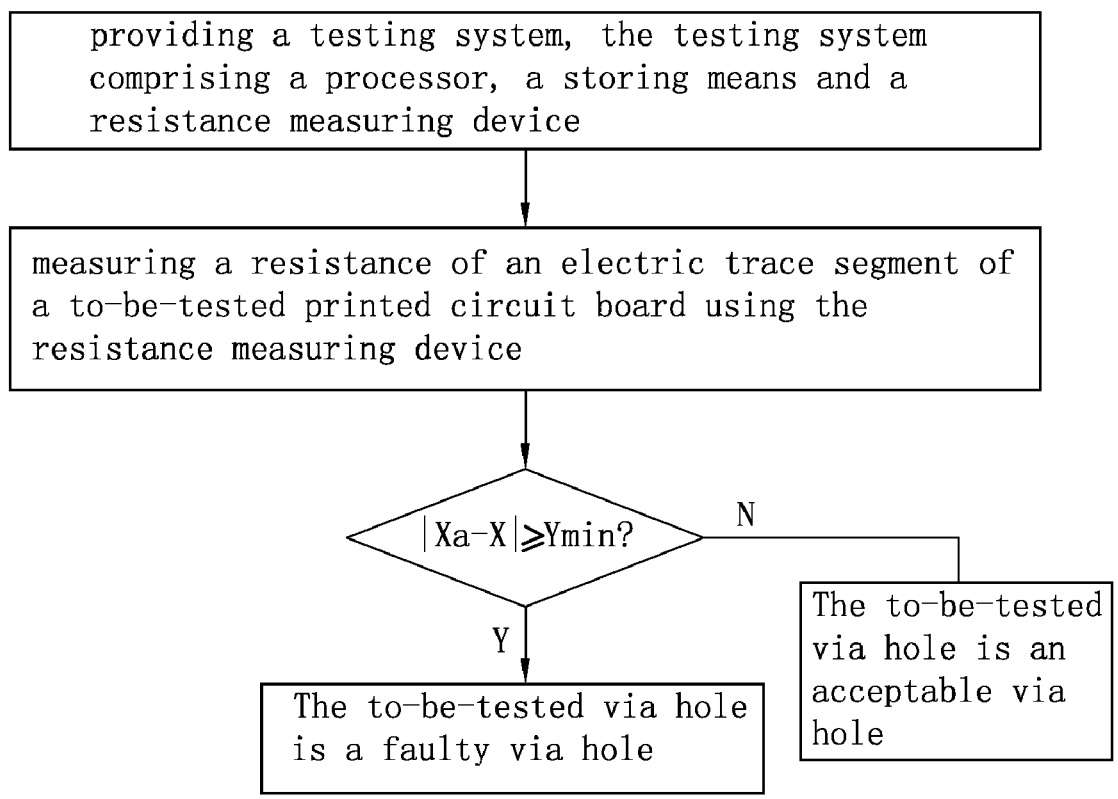
FIG. 6 illustrates a method of detecting faults in holes of printed circuit boards in accordance with an embodiment.

A four line flying probe test system can be used to measure the resistance of the electric trace segments. Referring to FIG. 4, a fixture 200 can be used to hold the printed circuit board 10. The fixture 200 includes a bottom plate 20 and a top plate 22. The top plate 22 includes a number of through holes 24 defined therein. A location of each through hole 24 is corresponds to each of the testing points 14. Referring to FIG. 5, the printed circuit boar 10 is placed and sandwiched between the bottom plate 20 and the top plate 22. The flying probe (not shown) of the flying probe test system can be inserted into the through holes 24 to contact with the testing points 14.

The electric trace segments 122 in the printed circuit board 10 may have different standard resistances. These standard resistances distribute in a certain range, e.g., from 0.01 to 2 ohms ($\Omega$). Five or more electric trace segments in the printed circuit board 10, whose resistances are well-distributed in the range, can be selected as sample electric trace segments.

In step 2, m pieces of printed circuit boards, labeled as L1, L2, ..., Lm, are provided. Printed circuit boards L1, L2, ..., Lm have same structure to the printed circuit board 100, but may contain faults in conductive holes. These printed circuit boards are used to establish a relation between resistance difference and certain type of fault.

In step 3, in order to establish such a relation, 22 electric trace segments S1, S2, S3, ..., S21, S22, whose standard resistance are $0.01\Omega, 0.05\Omega, 0.1\Omega, 0.2\Omega, 0.3\Omega, ..., 1.9\Omega, 2\Omega$ respectively, in printed circuit boards L1, L2, ..., Lm are selected as sample electric trace segments. It is to be understood that these standard resistance are illustrative examples; the resistance may vary according to a certain printed circuit board. For example, there is no electric trace segment whose standard resistance is $0.1\Omega$ but there is a electric trace segment whose standard resistance is $0.09\Omega$. The electric trace segment can be selected as sample electric trace segment.

In step 4, a resistance of each sample electric trace segment in each of printed circuit boards L1, L2, ..., Lm is measured, and the index of the printed circuit board, the resistance difference of the electric trace segment whose resistance difference exceed a predetermined range are recorded. The resistance difference represents a difference between a measured resistance and the standard resistance of a certain electric trace segment. For example, a certain sample electric trace segment has a standard resistance Xn, a measured resistance of the certain sample electric trace segment in the printed circuit board labeled as L1 is Yn, the resistance difference $\Delta Y_n$ equal to $Y_n - X_n$. The predetermined range varies in accordance with a certain type of fault in the conductive holes, such as impurity, over-etching and disconnection. The range can be obtained from test results. For example, with respect to flexible printed circuit boards, scrap of adhesive layer remain in conductive through holes can increase a resistance of the electric trace segment more than 20%.

If a numerical value of $\Delta Y_n/X_n$ is larger than the predetermined range (e.g., 20%), then the index of the printed circuit board and the resistance difference of the electric trace segment are recorded in Table 1. For example, sample electric trace segment S1 in printed circuit board L1 has a standard resistance $0.01\Omega$, a measured resistance is $0.014\Omega$, $\Delta Y_n/X_n$ thereof equals 40%, and therefore the index of the printed circuit board L1 and the resistance difference $0.004\Omega$ are recorded in Table 1. Adequate printed circuit boards must be provided such that each cell in column 3 of table includes at least five or more records.

TABLE 1

| Sample electric trace segment label | Standard resistance | Printed circuit board label and resistance difference |
| --- | --- | --- |
| S1 | $0.01\Omega$ | $L1 - 0.004\Omega, ...$ |
| S2 | $0.05\Omega$ | ... |
| S3 | $0.1\Omega$ | ... |
| S4 | $0.2\Omega$ | ... |
| S5 | $0.3\Omega$ | ... |
| ... | ... | ... |
| S21 | $1.9\Omega$ | ... |
| S22 | $2\Omega$ | ... |

In step 5, the electric trace segments with resistance differences exceed a predetermined range are verified, the verified result (i.e., whether or not the electric trace segments includes the certain type of fault after the resistance differences) are recorded. In this embodiment, micro section analysis is performed on each of the electric trace segments and the inner portions of conductive holes are observed via a microscope. A certain type of fault, i.e., scrap of adhesive layer remaining in the through hole, analyzed and the resistance difference is recorded in Table 2. A count of records in each cell of column 3 of table 2 can be different. For example, in the cell corresponding to S1, there are 5 records, and the cell corresponding to S2 there are 6 records.

TABLE 2

| Sample electric trace segment label | Standard resistance | Resistance difference |
| --- | --- | --- |
| S1 | $0.01\Omega$ | $\Delta Y_{11}, \Delta Y_{12}, ..., \Delta Y_{1n}$ |
| S2 | $0.05\Omega$ | $\Delta Y_{21}, \Delta Y_{22}, ..., \Delta Y_{2n}$ |
| S3 | $0.1\Omega$ | $\Delta Y_{31}, \Delta Y_{32}, ..., \Delta Y_{3n}$ |
| S4 | $0.2\Omega$ | $\Delta Y_{41}, \Delta Y_{42}, ..., \Delta Y_{4n}$ |
| S5 | $0.3\Omega$ | $\Delta Y_{51}, \Delta Y_{52}, ..., \Delta Y_{5n}$ |
| ... | ... | ... |
| S21 | $1.9\Omega$ | $\Delta Y_{211}, \Delta Y_{212}, ..., \Delta Y_{21n}$ |
| S22 | $2\Omega$ | $\Delta Y_{221}, \Delta Y_{222}, ..., \Delta Y_{22n}$ |

In order to find a resistance difference range corresponds to each sample electric trace segment, a maximum value and a minimum value of resistance difference in each cell of column 3 of table 2 are calculated and recorded. In this embodiment, the results are recorded in table 3.

TABLE 3

| Sample electric trace segment label | Standard resistance | Maximum resistance difference | Minimum resistance difference |
| --- | --- | --- | --- |
| S1 | $0.01\Omega$ | Max1 | Min1 |
| S2 | $0.05\Omega$ | Max2 | Min2 |
| S3 | $0.1\Omega$ | Max3 | Min3 |
| S4 | $0.2\Omega$ | Max4 | Min4 |
| S5 | $0.3\Omega$ | Max5 | Min5 |
| ... | ... | ... | ... |
| S21 | $1.9\Omega$ | Max21 | Min21 |
| S22 | $2\Omega$ | Max22 | Min22 |

In step 6, regression analysis is performed on the data stored in columns 2 and 3 of table 3 thereby obtain a function of $\Delta Y_{max} = f_{max}(X)$, which represents a relation between the maximum resistance difference caused by a certain type of fault and the standard resistance. Regression analysis is performed on the data stored in columns 2 and 4 of table 3 thereby obtain a function of $\Delta Y_{min}=f_{min}(X)$, which represents a relation between the minimum resistance difference caused by a certain type of fault and the standard resistance. It is understood that difference between $\Delta Y_{max}=f_{max}(X)$ and $\Delta Y_{min}=f_{min}(X)$ represent resistance difference caused by other type of fault can also be obtained in a similar way. Standard resistances, $\Delta Y_{max}=f_{max}(X)$, $\Delta Y_{max}=f_{max}(X)$ can be stored in a storing means, for example, storing means 16 in the testing system 100.

Preferably, the standard resistances of the sample electric trace segments can be divided into several sections. Above mentioned regression analysis can be performed in each section. For example, 0.01Ω-2Ω can be divided into 4 sections: 0.01Ω-0.1Ω, 0.1Ω-0.5Ω, 0.5Ω-1Ω, 1Ω-2Ω. $\Delta Y_{max}=f_{max}(X)$ and $\Delta Y_{min}=f_{min}(X)$ are calculated in each section.

FIG. 5 illustrates a method of detecting faults in holes of printed circuit boards using the testing system 100, the method will be described in detail with the following embodiment.

Firstly, the data stored in the storing means 16 is read into the processor 18. The data describes location information and standard resistance of at least one electric trace segment in the printed circuit board, and a criteria of whether the electric trace segment includes a certain type of fault based on a difference between the actual resistance and the standard resistance of electric trace segment (i.e. the aforementioned functions $\Delta Y_{max}=f_{max}(X)$ and $\Delta Y_{min}=f_{min}(X)$).

Secondly, the processor 18 controls the resistance measuring device 14 to measure resistance of electric trace segments according to the location information.

Thirdly, judging whether the electric trace segment including the certain type of fault according to a measured resistance, standard resistance of electric trace segment and the definition. For example, if a electric trace segment in the printed circuit board has a standard resistance X, a measured resistance is Y. $\Delta Y_{max}$ and $\Delta Y_{min}$ are calculated according to $\Delta Y_{max}=f_{max}(X)$ and $\Delta Y_{min}=f_{min}(X)$ respectively. If Y is between $\Delta Y_{max}$ and $\Delta Y_{min}$ then the electric trace segment is recorded as having the certain type of fault represented by $\Delta Y_{max}=f_{max}(X)$ and $\Delta Y_{min}=f_{min}(X)$.

If the electric trace segment includes the certain type of fault, the processor 18 controls the picking and dropping mechanism 12 to picking the printed circuit boards including the certain type of fault and drop the printed circuit board to a given location.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for detecting whether or not a printed circuit board has a faulty via hole, the printed circuit board including a plurality of electric trace segments, the method comprising:
   providing a testing system, the testing system comprising a processor, a storing means, and a resistance measuring device, the storing means storing a first function: $Y_{min}=f_{min}(X)$, wherein X represents a reference resistance associated with a given electric trace segment, and $Y_{min}$ represents a minimum threshold value associated with the given electric trace segment; the first function being determined by:
   providing a plurality of standard printed circuit boards having the same structure of the printed circuit board, each standard printed circuit board having a standard electric trace segment corresponding to the given electric trace segment;
   measuring resistances of the standard electric trace segments;
   averaging the resistances of the standard electric trace segments as the reference resistance of the given electric trace segment;
   providing a plurality of sample printed circuit boards having the same structure of the printed circuit board, each sample printed circuit board having a sample electric trace segment corresponding to the given electric trace segment;
   measuring resistances of the sample electric trace segments;
   marking a portion of the sample printed circuit boards whose resistances exceed the reference resistance by a predetermined range;
   verifying the type of faulty via hole of the electric trace segment of each marked printed circuit board; and
   taking the minimum of resistance differences between the reference resistance and the reference of the sample electric trace segment of each marked printed circuit board as the minimum threshold value of the given electric trace segment;
   measuring a resistance of the given electric trace segment using the resistance measuring device, a to-be-tested via hole being located on the given electric trace segment; and
   judging whether or not the to-be-tested via hole is a faulty via hole using the processor according to the following criteria: if $|Xa-X| \geq Y_{min}$, the to-be-tested via hole is a faulty via hole, and
   if $|Xa-X| < Y_{min}$, the to-be-tested via hole is an acceptable via hole, wherein Xa represents the resistance of the given electric trace segment.

2. The method of claim 1, wherein the testing system further comprises a picking and dropping mechanism, and the processor controls the picking and dropping mechanism to pick and drop the printed circuit board to a given location if the printed circuit board includes a faulty via hole.

3. The method of claim 2, wherein the picking and dropping mechanism is selected from the group consisting of a robot arm, a vacuum pad, and a vacuum plate.

4. The method of claim 1, wherein the resistance measuring device comprises a pair of flying probes configured for measuring the resistance of the given electric trace segment.

5. The method of claim 1, wherein the resistance measuring device comprises a fixture, and the fixture comprises a bottom plate and a top plate configured for sandwiching the printed circuit board therebetween, the top plate defining a number of through holes corresponding to a number of test points located on the electric trace segments for measuring resistances of the electric trace segments.

6. The method of claim 1, wherein the storing means further stores a second function: $Y_{max}=f_{max}(X)$, wherein $Y_{max}$ represents a maximum threshold value and is the maximum of the resistance differences between the reference resistance and the reference of each sample electric trace segment having a certain type of faulty via hole;
   the method further comprising judging whether the to-be-tested via hole is the certain type of faulty via hole according to the following criteria: if $Y_{min} \leq |Xa-X| \leq Y_{max}$, the to-be-tested via hole is a faulty via hole in the certain type.

* * * * *